US012537367B2

(12) United States Patent
Pan et al.

(10) Patent No.: US 12,537,367 B2
(45) Date of Patent: Jan. 27, 2026

(54) JUMPER BUS BAR WITH PDM HOUSING SUPPORT

(71) Applicant: Suzhou Littelfuse OVS Co., Ltd., Suzhou (CN)

(72) Inventors: Shangchun Pan, Suzhou (CN); Renan Liu, Suzhou (CN); Edward Jin, Suzhou (CN)

(73) Assignee: Suzhou Littelfuse OVS Co., Ltd., Suzhou (CN)

( * ) Notice: Subject to any disclaimer, the term of this patent is extended or adjusted under 35 U.S.C. 154(b) by 581 days.

(21) Appl. No.: 17/963,694

(22) Filed: Oct. 11, 2022

(65) Prior Publication Data

US 2023/0131568 A1 Apr. 27, 2023

(30) Foreign Application Priority Data

Oct. 21, 2021 (CN) ......................... 202111227175.2

(51) Int. Cl.

| | |
|---|---|
| ***H02B 1/20*** | (2006.01) |
| ***H01R 13/11*** | (2006.01) |
| ***H01R 33/88*** | (2006.01) |
| ***H02B 1/46*** | (2006.01) |

(52) U.S. Cl.

CPC ............. *H02B 1/20* (2013.01); *H01R 13/112* (2013.01); *H01R 33/88* (2013.01); *H02B 1/46* (2013.01)

(58) Field of Classification Search

CPC .......... H02B 1/20; H01R 9/28; H01R 13/112; H01R 4/48

USPC .......................................................... 439/512

See application file for complete search history.

(56) References Cited

U.S. PATENT DOCUMENTS

| | | | | |
|---|---|---|---|---|
| 6,051,781 A | | 4/2000 | Bianca | |
| 6,848,915 B1 | | 2/2005 | Perhats, Sr. | |
| 2004/0116003 A1 | | 6/2004 | Wessner | |
| 2016/0254627 A1 | * | 9/2016 | Byrne | H01R 11/01 439/119 |
| 2019/0132966 A1 | * | 5/2019 | Mitsui | H05K 3/202 |
| 2020/0107477 A1 | | 4/2020 | Webber | |

FOREIGN PATENT DOCUMENTS

| | | |
|---|---|---|
| DE | 4104653 C1 | 3/1992 |
| GB | 2330249 A | 4/1999 |
| WO | 9838706 A1 | 9/1998 |
| WO | 2016138386 A1 | 9/2016 |

OTHER PUBLICATIONS

European Search Report and Written Opinion for the European Application No. EP22201385, mailed Jun. 20, 2023, 12 pages.

* cited by examiner

*Primary Examiner* — Abdullah A Riyami
*Assistant Examiner* — Amara Anderson
(74) *Attorney, Agent, or Firm* — KDW Firm PLLC

(57) ABSTRACT

A jumper bus bar may include a frame and a terminal assembly. The frame is to be seated along a surface of a housing of an electrical box. The terminal assembly features a first fork terminal perpendicular to the frame and a second fork terminal perpendicular to the frame. The first fork terminal is adjacent the second fork terminal. The terminal assembly also includes a slot to receive a terminal of a fuse or relay, the slot being coplanar with the frame.

18 Claims, 14 Drawing Sheets

JUMPER BUS BAR WITH PDM HOUSING SUPPORT

FIELD OF THE DISCLOSURE

Embodiments of the present disclosure relate to electrical boxes that house fuses and relays and, more particularly, to a modification of the electrical bus within the electrical box.

BACKGROUND

Power distribution modules (PDMs) are sealed electrical boxes that are installed into applications, such as automotive environments, to ensure circuits are protected, controlled, and/or sensed. PDMs may consist of fuses and relays, for example. The PDMs thus protect and distribute current throughout the environment.

Current is moved around the PDM using an electrical bus. The electrical bus may consist of a network of direct wires, as one example, connected to each relay and fuse within the PDM. Or the electrical bus may be made up of one or more bus bars. A bus bar is a matrix of copper bars and connections to form a circuit connecting the fuses and relays. As another option, the electrical bus may use a printed circuit board assembly (PCBA) in which traces on the PCBA establish the connections to the fuses and relays. In some PDMs, the electrical bus consists of a hybrid configuration, including bus bar(s), PCBA(s), and/or direct wiring.

PDMs come in a variety of sizes. The PDM includes dedicated slots for the insertion of fuses and/or relays within its housing. The PDM may be populated with fuses and/or relays upon purchase by the customer. Or the PDM may be empty, with the customer purchasing just the number of fuses and relays needed for a given application. A customer needing four fuses and two relays may purchase a PDM that supports eight fuses and four relays, for example, with the unused slots remaining empty but available for future use.

If the electrical bus of the PDM uses direct wiring, wiring for each terminal of each device would be needed. Thus, for each two-terminal fuse, two wires would be needed. For a four-terminal relay, four wires would be needed. The process of wiring the PDM for each component within the PDM is complex, which may be daunting for some customers.

Relative to direct wiring, bus bars and PCBAs are expensive, with PCBAs being the most expensive of the three types of electrical bus materials. Particularly when the customer populates the PDM with fewer fuses and relays than are supported by the PDM, these electrical bus features may be cost-prohibitive.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a jumper bus bar in accordance with the present disclosure may include a frame and a terminal assembly. The frame is to be seated along a surface of a housing of an electrical box. The terminal assembly features a first fork terminal perpendicular to the frame and a second fork terminal perpendicular to the frame. The first fork terminal is adjacent the second fork terminal. The terminal assembly also includes a slot to receive a terminal of a fuse or relay, the slot being coplanar with the frame.

An exemplary embodiment of a power distribution module to house a fuse and/or relay in accordance with the present disclosure may include a housing and a jumper bus bar. The housing includes a substantially flat surface and a cavity that is perpendicular to the surface. The cavity includes a pair of ribs extending upward from a bottom surface of the cavity with a channel formed between the ribs. The jumper bus bar includes a frame to be seated upon the surface and a terminal assembly to be placed within the cavity.

An exemplary embodiment of a housing for a power distribution module in accordance with the present disclosure may include a cavity to hold a terminal assembly of a jumper bus bar. The cavity includes a channel surrounded by two side channels, where the channel partially receives a terminal of a fuse or relay along with the terminal assembly.

DETAILED DESCRIPTION

Jumper bus bars are disclosed to be used in an electrical box such as a power distribution module. The jumper bus bars, which come in a variety of configurations, feature a frame that sits on a surface of a housing of the electrical box and one or more terminal assemblies which fit into dedicated cavities formed in the housing. A power distribution module utilizing the one or more jumper bus bars feature modified housing to accommodate the jumper bus bars, including housing cavities with ribs that facilitate good connection between the electrically conductive material of the terminal assembly and a terminal of the fuse or relay. The jumper bus bars enable the power distribution module to use much less bus bar material than is found in legacy power distribution modules.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

As described above, sealed electrical boxes known as power distribution modules (PDMs) provide circuit protection, control, and sensing for a variety of applications. The electrical bus used to move current through the fuses and/or relays within the PDM can consist of direct wiring, one or more bus bars, and/or printed circuit board assemblies (PCBAs). While direct wiring adds complexity to assembling the PDM, bus bars and PCBAs are expensive options, particularly for customers using only a portion of the available fuse/relay slots of the PDM.

Figure 1A:
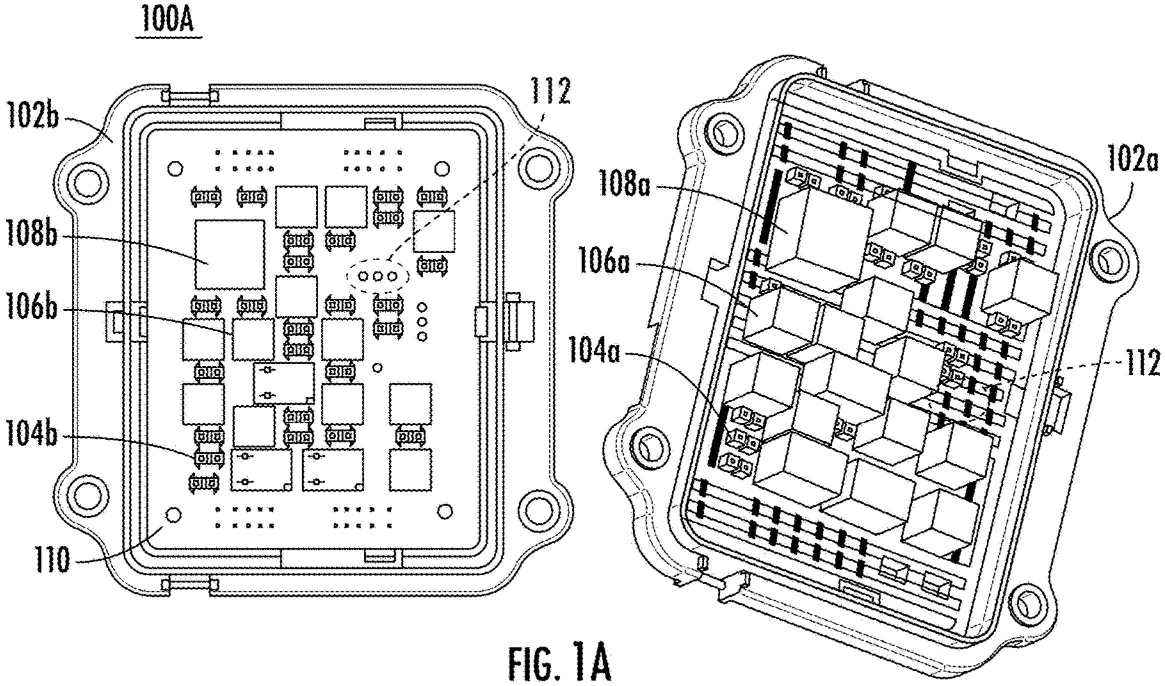
FIGS. 1A-1C are diagrams illustrating electrical bus designs for PDMs, in accordance with the prior art.
Figure 1B:
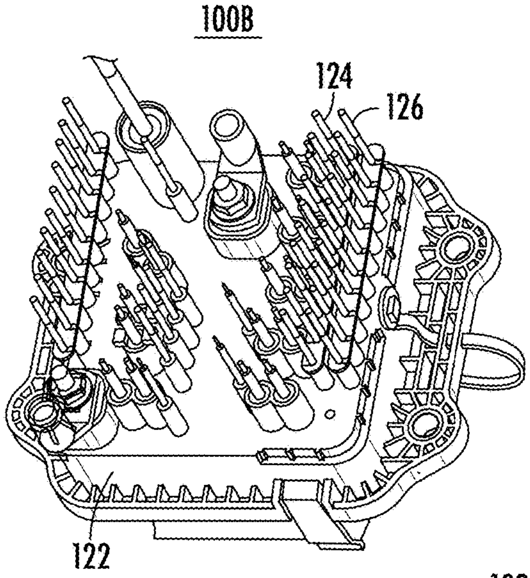
Figure 1C:
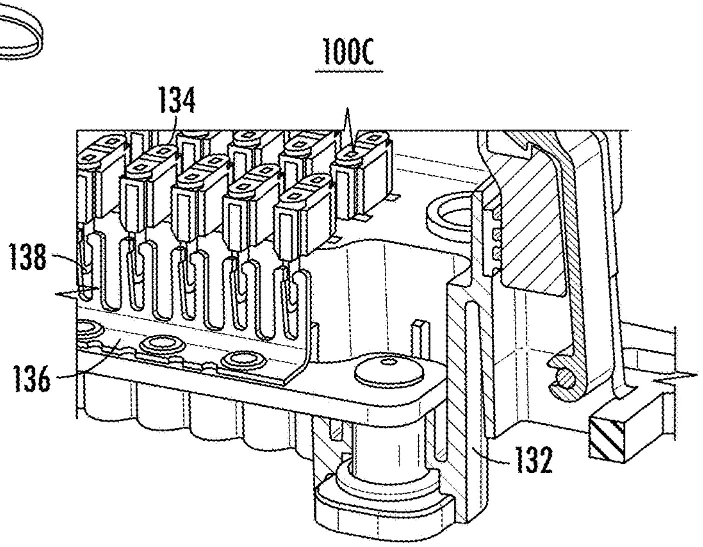

FIGS. 1A-1C are representative drawings of electrical bus designs for power distribution modules (PDMs), according to the prior art. FIG. 1A is a side view of an electrical bus design using a printed circuit board assembly (PCBA); FIG. 1B is a perspective view of a direct wire-based electrical bus design; and FIG. 1C is a perspective view of a bus bar-based electrical bus design.

The prior art PDM electrical bus design 100A (FIG. 1A) features a housing 102*a* including the devices of the PDM and a backside view of the housing 102*b* including a PCBA 110 (collectively, "housing 102"). The PCBA 110 in the backside view of the housing 102*b* includes location indicators 104*b*, 106*b*, and 108*b* for respective fuses 104*a*, small relays 104*a*, and large relays 108*a* (collectively, "fuses 104", "small relays 106", and "large relays 108"). Open slots 112 are also shown, as not every available position of the PCBA 110 is populated with a fuse or relay. Due to the presence of the expensive PCBA 110, the electrical bus design 100A is expensive even when the PDM is fully populated with fuses and relays but is particularly expensive when not fully populated.

The prior art PDM electrical bus design 100B (FIG. 1B) features a backside view of a housing 122 showing many wires extending out from the housing, with fuses, small relays, and/or large relays populating the opposite side of the housing. Wires 124 and 126 could be connected to a fuse or relay. A customer order of the electrical bus design 100B thus may consist of 1) purchasing an unpopulated PDM; 2) purchasing the desired number of fuses and/or relays; 3) purchasing wires for each device, with one wire being needed for each terminal of each device; 4) inserting the fuses and/or relays on one side of the housing 122; and 5) add the wires to connect to each terminal of each inserted device. For some customers, the direct wire-based electrical bus design 100B may be too complex.

The prior art PDM electrical bus design 100C (FIG. 1C) features a housing 132 with a bus bar 136 and fuses 134 connected to the bus bar via dedicated tines 138, a pair of tines for each fuse. Although not as expensive as the PCBA-based electrical bus design 100A, the bus bar 136 is an expensive component, particularly when the housing 132 is not fully populated with fuses and/or relays.

In addition to the examples shown, PDMs may have electrical buses that are a hybrid configuration of direct wiring, one or more bus bars, and one or more PCBAs. The prior art PDM designs are thus either complex for the customer, as in the direct wire design, or expensive, as in the bus bar- and PCBA-based designs.

Figure 2A:
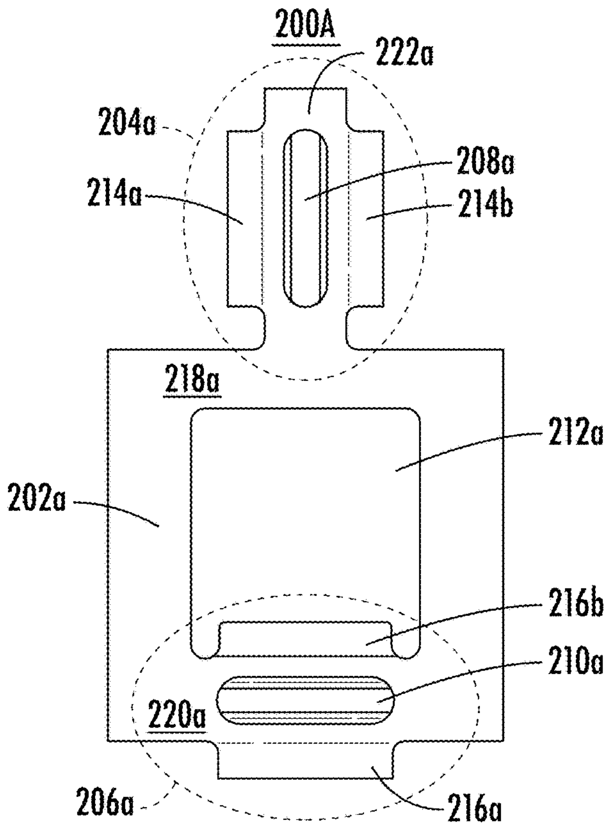
FIGS. 2A-2H are diagrams illustrating jumper bus bars for PDMs, in accordance with exemplary embodiments.
Figure 2B:
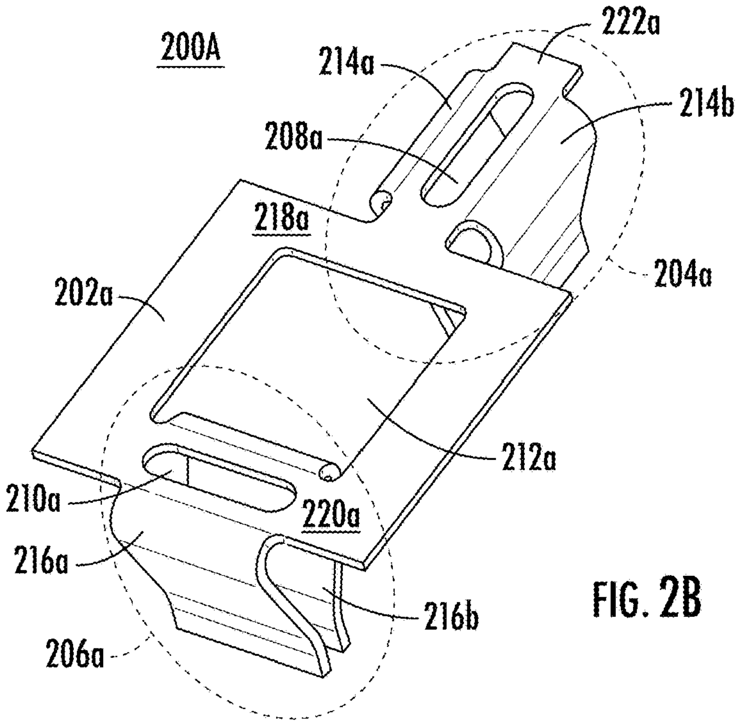
Figure 2C:
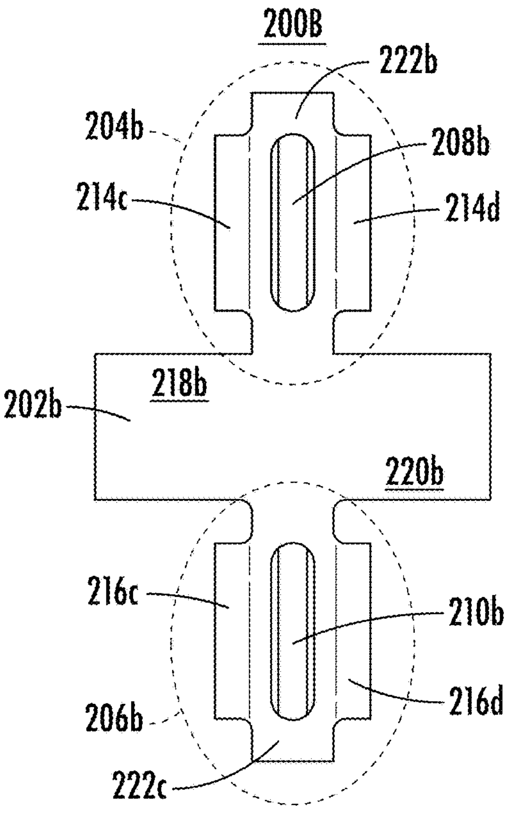
Figure 2D:
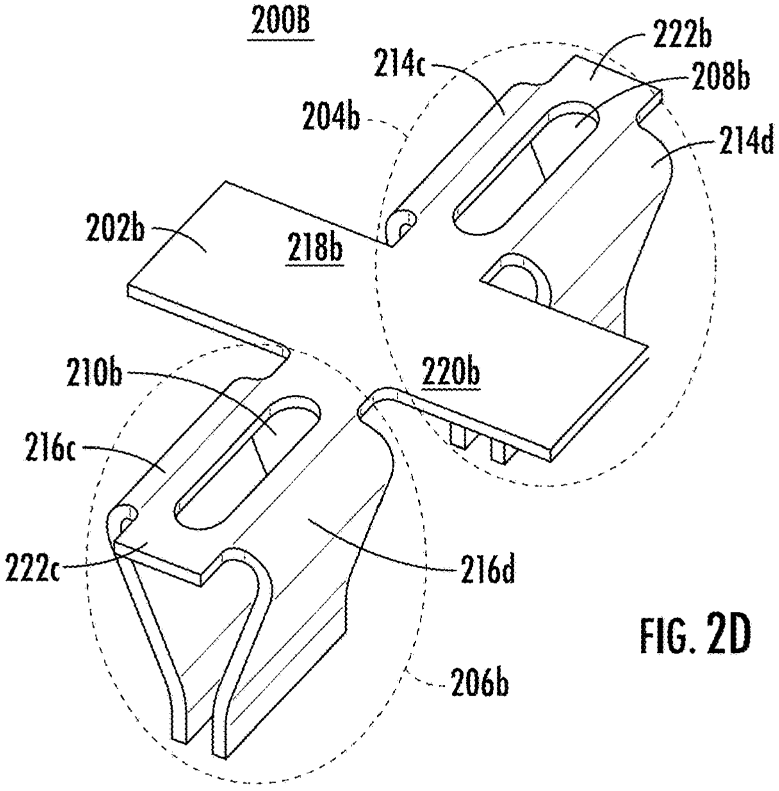
Figure 2E:
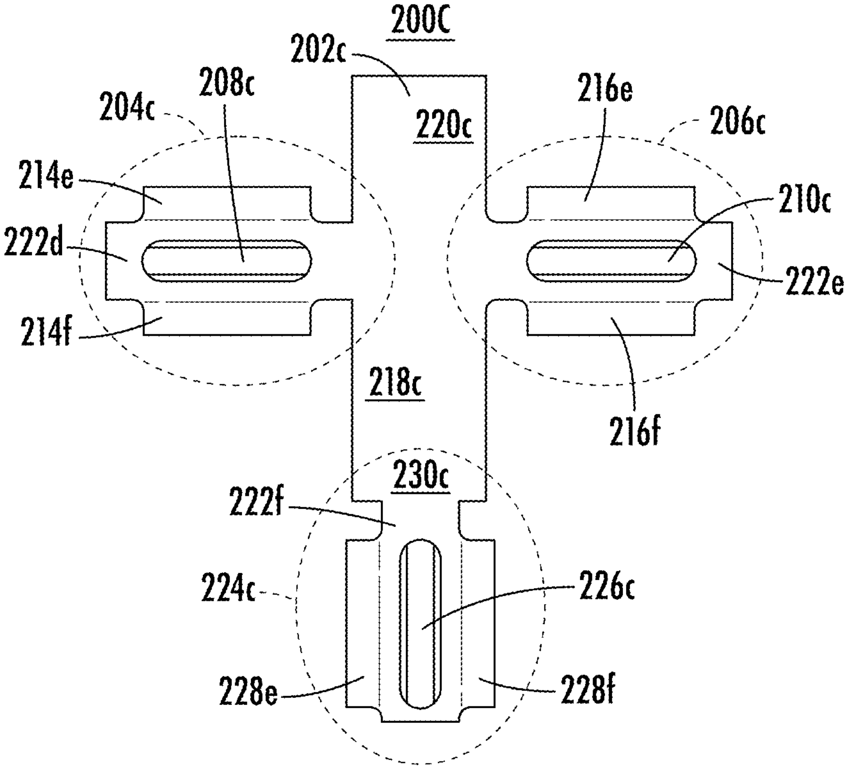
Figure 2F:
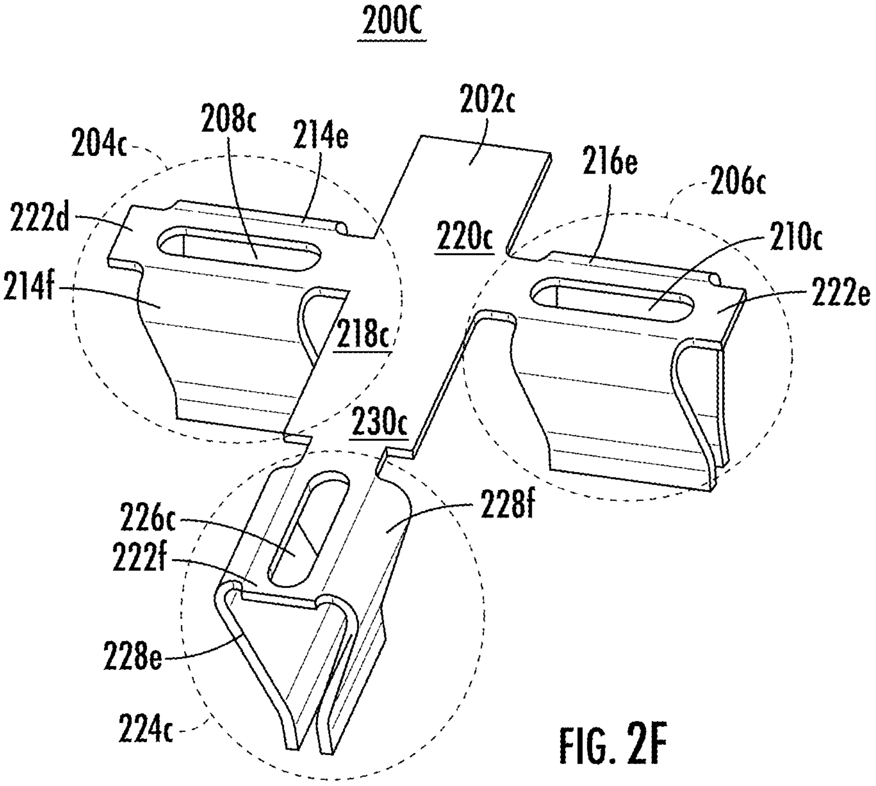
Figure 2G:
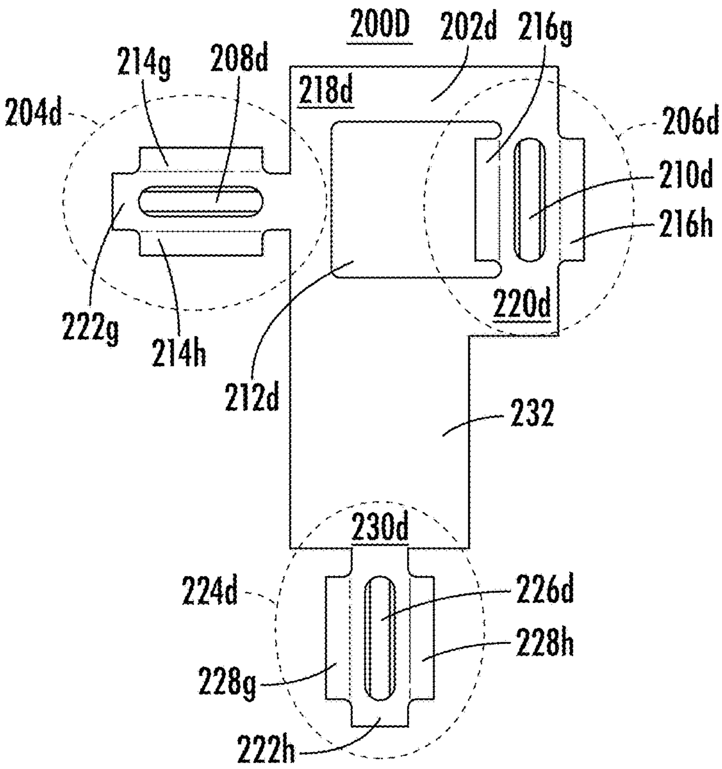
Figure 2H:
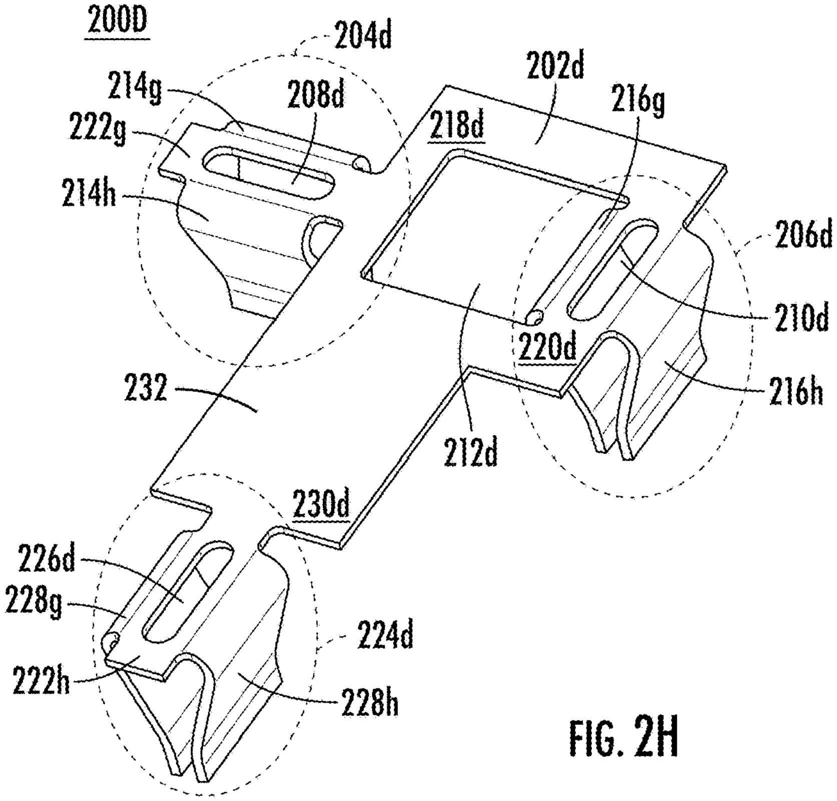

FIGS. 2A-2H are representative drawings of jumper bus bars to be used in an electrical box such as a PDM, according to exemplary embodiments. FIG. 2A is an overhead view and FIG. 2B is a perspective view of jumper bus bar 200A; FIG. 2C is an overhead view and FIG. 2D is a perspective view of jumper bus bar 200B; FIG. 2E is an overhead view and FIG. 2F is a perspective view of jumper bus bar 200C; FIG. 2G is an overhead view and FIG. 2H is a perspective view of jumper bus bar 200D. Along with modifications to the housing of the PDM, as illustrated and described in FIGS. 3A-3C below, the jumper bus bars 200 are designed to overcome the shortcomings of the prior art electrical bus designs in PDMs. Jumper bus bar 200A (FIGS. 2A-2B), jumper bus bar 200B (FIGS. 2C-2D), jumper bus bar 200C (FIGS. 2E-2F) and jumper bus bar 200D (FIGS. 2G-2H) are collectively known herein as "jumper bus bar(s) 200".

The jumper bus bars 200 shown and described herein include frames 202*a-d* (collectively, "frame(s) 202"), first terminal assemblies 204*a-d* (collectively, "terminal assembly/assemblies 204", second terminal assemblies 206*a-d* (collectively, "terminal assembly/assemblies 206"), and optionally, third terminal assemblies 224*c-d* (collectively, "terminal assembly/assemblies 224"). The jumper bus bars 200 also feature first slots 208*a-d* (collectively, "slot(s) 208"), second slots 210*a-d* (collectively, "slot(s) 210"), and optionally, third slots 226*c-d* (collectively, "slot(s) 226"), first fork terminals 214*a-h* (collectively, "fork terminal(s) 214"), second fork terminals 216*a-h* (collectively, "fork terminal(s) 216"), and optionally, third fork terminals 228*e-h* (collectively, "fork terminal(s) 228"). The jumper bus bars 200 optionally include frame apertures 212*a, d* (collectively, "frame aperture(s) 212") and appendages 222*a-h* (collectively, "appendage(s) 222"), first sides 218*a-d* (collectively, "side(s) 218"), second sides 220*a-e* (collectively, "side(s) 220"), and optionally third sides 230*c-d* (collectively, "side(s) 230").

In exemplary embodiments, as shown in FIGS. 2A-2B, jumper bus bar 200A includes a frame 202*a* with an appendage 222*a*, a first terminal assembly 204*a*, and a second terminal assembly 206*a*. The appendage 222*a* is an extension of and is coplanar to the frame 202*a*. The terminal assembly 204*a* extends perpendicularly outwardly (i.e., away from a first side 218*a*) along the appendage 222*a* of the frame 202*a*. The terminal assembly 206*a* is disposed along a second, opposing side 220*a* of the frame 202*a*. The terminal assemblies 204*a* and 206*a* are designed to affix the jumper bus bar 200A into housing of a PDM and connect to the electrical bus of the PDM, thus supplying a path for current to fuses and/or relays within the PDM, as shown and described in more detail below.

In exemplary embodiments, the frame 202*a* is a substantially rectangular member formed of an electrically conductive material, such as copper or copper alloy. The frame 202*a* is to be disposed adjacent a surface of the PDM housing while the terminal assemblies 204*a* and 206*a* are inserted into dedicated cavities of the housing, as shown below. The frame 202*a* includes a frame aperture 212*a* which provides a cost-saving reduction in the amount of copper material making up the frame while still maintaining the strength provided by its rectangular structure. The bus bar 200A, including the frame 202*a*, the appendage 222*a*, the terminal assembly 204*a*, and the terminal assembly 206*a*, may be formed from a single piece of conductive material (e.g., stamped from a single sheet of copper or copper alloy).

The terminal assembly 204*a* includes a slot 208*a* for receiving a terminal of a fuse or relay, a first fork terminal 214*a*, and a second fork terminal 214*b*. The fork terminals 214 are disposed on opposite sides of and extend orthogonally downward from the slot 208*a*, which is coplanar to the appendage 222*a*. In exemplary embodiments, the fork terminals 214 are wider at a slot connection point (e.g., adjacent the slot 208*a*), then become narrow at a bottom point, such that fork terminal 214*a* is closer to fork terminal 214*b* at the bottom point than at the slot connection point. The terminal assembly 204*a* is part of the appendage 222*a* of the frame 202*a*, but the fork terminals 214 do not strictly extend downward at a right angle to the appendage. Instead, the fork terminal 214*a* assumes a curved shape in a downward direction from the appendage 222*a*, and faces the fork terminal 214*b*, which also has a curved shape extending in a downward direction from the appendage.

The terminal assembly 206*a* similarly includes a slot 210*a* for receiving a terminal of a fuse or relay, a first fork terminal 216*a* and a second fork terminal 216*b*. The fork terminals 216 are disposed on opposite sides of and extend orthogonally downward from the slot 210*a*, which is coplanar to the frame 202*a*. In exemplary embodiments, the fork terminals 216 are wider at a slot connection point (e.g., adjacent the slot 210*a*), then become narrow at a bottom point, such that fork terminal 216*a* is closer to fork terminal 216*b* at the bottom point than at the slot connection point. Rather than being vertically disposed relative to the frame 202*a*, the fork terminals 216*a* and 216*b* assume downward curved shapes facing one another.

In exemplary embodiments, as shown in FIGS. 2C-2D, jumper bus bar 200B includes a frame 202*b* with a first appendage 222*b* with a first terminal assembly 204*b*, and a second appendage 222*c* with a second terminal assembly 206*b*. The appendages 222*b* and 222*c* are extensions of and are coplanar to the frame 202*b*, with the appendage 222*b* extending outward orthogonally from side 218*b* and appendage 222*c* extending outward orthogonally from side 220*b*. Likewise, the terminal assembly 204*b* extends perpendicularly outwardly (i.e., away from side 218*b*) along the appendage 222*b* while the terminal assembly 206*b* extends perpendicularly outwardly (i.e., away from side 220*b*) along the appendage 222*c* of the frame 202*b*. The terminal assemblies 204*b* and 206*b* are designed to affix the jumper bus bar 200B into housing of a PDM and connect to the electrical bus of the PDM, thus supplying a path for current to fuses and/or relays within the PDM, as shown and described in more detail below.

In exemplary embodiments, the frame 202*b* is a substantially rectangular member formed of an electrically conductive material, such as copper or copper alloy. The frame 202*b* is to be disposed adjacent a surface of the PDM housing while the terminal assemblies 204*b* and 206*b* are inserted into dedicated cavities of the housing, as shown below. A frame aperture is not shown in the frame 202*b*, although the jumper bus bar 200B may optionally include one, as with the frame 202*a* (FIGS. 2A-2B). The jumper bus bar 200B, including the frame 202*b*, the appendage 222*b*, the terminal assembly 204*b*, the appendage 222*c*, and the terminal assembly 206*b*, may be formed from a single piece of conductive material.

The terminal assembly 204*b* includes a slot 208*b* for receiving a terminal of a fuse or relay, a first fork terminal 214*c*, and a second fork terminal 214*d*. The fork terminals 214 are disposed on opposite sides of and extend orthogonally downward from the slot 208*b*, which is coplanar to the appendage 222*b*. The terminal assembly 206*b* similarly includes a slot 210*b* for receiving a terminal of a fuse or relay, a first fork terminal 216*c* and a second fork terminal 216*d*. The fork terminals 216 are disposed on opposite sides of and extend orthogonally downward from the slot 210*b*, which is coplanar to the frame 202*b*.

In exemplary embodiments, as shown in FIGS. 2E-2F, jumper bus bar 200C includes a frame 202*c* with a first appendage 222*d* with a first terminal assembly 204*c*, a second appendage 222*e* with a second terminal assembly 206*c*, and a third appendage 222*f* with a third terminal assembly 224*c*. The appendages 222*d*, 222*e*, and 222*f* are extensions of and are coplanar to the frame 202*c*, with the appendage 222*d* extending outward orthogonally from side 218*c*, appendage 222*e* extending outward orthogonally from side 220*c*, and appendage 222*f* extending outward orthogonally from side 230*c*. Appendages 222*d* and 222*e* align on a first axis while appendage 222*f* aligns on a second axis which is perpendicular to the first axis. Likewise, the terminal assembly 204*c* extends perpendicularly outwardly (i.e., away from side 218*c*) along the appendage 222*d*, the terminal assembly 206*c* extends perpendicularly outwardly (i.e., away from side 220*c*) along the appendage 222*e*, and the terminal assembly 224*c* extends perpendicularly outwardly (i.e., away from side 230*c*) along the appendage 222*f* of the frame 202*c*. The terminal assemblies 204*c*, 206*c*, and 224*c* are designed to affix the jumper bus bar 200C into housing of a PDM and connect to the electrical bus of the PDM, thus supplying a path for current to fuses and/or relays within the PDM, as shown and described in more detail below.

In exemplary embodiments, the frame 202*c* is a substantially rectangular member formed of an electrically conductive material, such as copper or copper alloy. The frame 202*c* is to be disposed adjacent a surface of the PDM housing while the terminal assemblies 204*c*, 206*c*, and 224*c* are inserted into dedicated cavities of the housing, as shown below. A frame aperture is not shown in the frame 202*c*, although the jumper bus bar 200C may optionally include one, as with the frame 202*a* (FIGS. 2A-2B). The jumper bus bar 200C, including the frame 202*c*, the appendage 222*d*, the terminal assembly 204*c*, the appendage 222*e*, the terminal assembly 206*c*, the appendage 222*f*, and the terminal assembly 234*c*, may be formed from a single piece of conductive material.

The terminal assembly 204*c* includes a slot 208*c* for receiving a terminal of a fuse or relay, a first fork terminal 214*e*, and a second fork terminal 214*f*. The fork terminals 214 are disposed on opposite sides of and extend orthogonally downward from the slot 208*c*, which is coplanar to the appendage 222*d*. The terminal assembly 206*c* similarly includes a slot 210*c* for receiving a terminal of a fuse or relay, a first fork terminal 216*e* and a second fork terminal 216*f*. The fork terminals 216 are disposed on opposite sides of and extend orthogonally downward from the slot 210*c*, which is coplanar to the frame 202*c*.

In exemplary embodiments, as shown in FIGS. 2G-2H, jumper bus bar 200D includes a frame 202*d* with a first appendage 222*g* with a first terminal assembly 204*d*, a second terminal assembly 206*d* connected to the frame, an extension 232 of the frame, and a second appendage 222*h* with a third terminal assembly 224*d*, the second appendage being connected to the extension. The appendages 222*g* and 222*h*, as well as the extension 232 are extensions of and are coplanar to the frame 202*d*, with the appendage 222*g* extending outward orthogonally from side 218*d*, and appendage 222*h* extending outward orthogonally from side 230*d*. Appendages 222*g* and 222*h* are perpendicular to one another. Likewise, the terminal assembly 204*d* extends perpendicularly outwardly (i.e., away from side 218*d*) along the appendage 222*g*, the terminal assembly 206*c* is disposed along the opposing side 220*d* of the frame 202*d*, and the terminal assembly 224*d* extends perpendicularly outwardly (i.e., away from side 230*d*) along the appendage 222*h* of the frame 202*d*. The terminal assemblies 204*d*, 206*d*, and 224*d* are designed to affix the jumper bus bar 200D into housing of a PDM and connect to the electrical bus of the PDM, thus supplying a path for current to fuses and/or relays within the PDM, as shown and described in more detail below.

In exemplary embodiments, the frame 202*d* is a substantially rectangular member formed of an electrically conductive material, such as copper or copper alloy. The frame 202*d* is to be disposed adjacent a surface of the PDM housing while the terminal assemblies 204*d*, 206*d*, and 224*d* are inserted into dedicated cavities of the housing, as shown below. The frame 202*d* includes a frame aperture 212*d*, though the frame aperture may optionally extend into the extended portion 232. The jumper bus bar 200D, including the frame 202*d*, the appendage 222*g*, the terminal assembly 204*d*, the terminal assembly 206*c*, the extended portion 232, the appendage 222*h*, and the terminal assembly 234*d*, may be formed from a single piece of conductive material.

The terminal assembly 204*d* includes a slot 208*d* for receiving a terminal of a fuse or relay, a first fork terminal 214*g*, and a second fork terminal 214*h*. The fork terminals 214 are disposed on opposite sides of and extend orthogonally downward from the slot 208*d*, which is coplanar to the appendage 222*g*. The terminal assembly 206*d* similarly includes a slot 210*d* for receiving a terminal of a fuse or relay, a first fork terminal 216*g* and a second fork terminal 216*h*. The fork terminals 216 are disposed on opposite sides of and extend orthogonally downward from the slot 210*d*, which is coplanar to the frame 202*d*.

In exemplary embodiments, the terminal assembly 204, the terminal assembly 206, and the terminal assembly 224 are functionally similar The terminal assemblies 204, 206, and 224 feature respective slots 208, 210, and 226 for receiving a terminal of a fuse or a relay. The terminal assemblies 204, 206, and 224 feature respective pairs of fork terminals 214, 216, and 228 for insertion into cavities of the PDM housing and for establishing an electrical connection between the fuse or relay and the electrical bus of the PDM.

In exemplary embodiments, the terminal assemblies 204, 206, and 224, though functionally similar, have some physical differences. Some terminal assemblies are part of an appendage 222 that extends perpendicularly from the frame 202 (e.g., terminal assemblies 204*a*, 204*b*, 206*b*, 204*c*, 206*c*, 224*c*, 204*d*, and 224*d*). Other terminal assemblies are part of the frame 202 (e.g., 206*a*, 206*d*). The disposition of the slots and terminal assemblies may vary. In the jumper bus bar 200A, the slots 208 and 210 are perpendicular to one another, as are the fork terminals of the respective terminal assemblies 204 and 206. By contrast, in the jumper bus bar 200B, the slots 208 and 210 line up with one another. In the jumper bus bar 200C, two slots 208 and 210 are in line with one another while a third slot 226 is perpendicular to the other two. In the jumper bus bar 200D, slots 210 and 226 are going in the same direction but are not lined up with one another, and both are perpendicular to slot 208. The present disclosure is not limited in this regard.

In exemplary embodiments, the variety of configurations of the jumper bus bars 200, specifically, the terminal assemblies, accommodate different arrangements and combinations of fuses, small relays, and large relays that may be encountered on a PDM. Further, the jumper bus bars 200 may include more than three terminal assemblies, in some embodiments. In exemplary embodiments, the jumper bus bars include a frame structure that will fit flush against the housing while the two or more terminal assemblies fit into cavities dedicated for them in the housing.

Figure 3A:
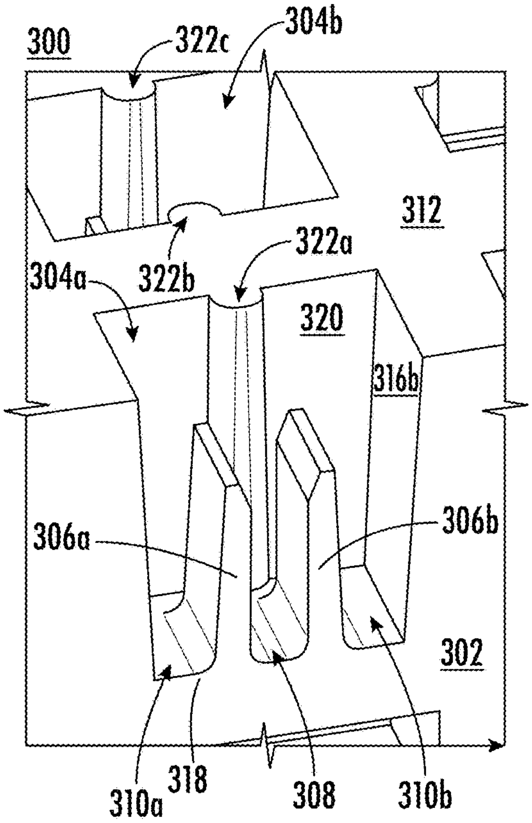
FIGS. 3A-3C are diagrams illustrating PDM housing elements to support jumper bus bars, in accordance with exemplary embodiments.
Figure 3B:
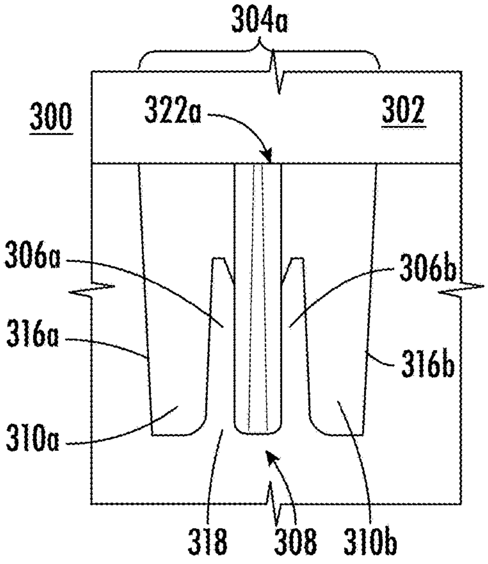
Figure 3C:
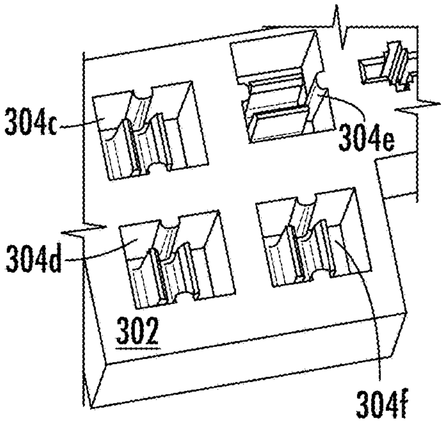

FIGS. 3A-3C are representative drawings of PDM housing elements 300 for the jumper bus bars 200 of FIGS. 2A-2H, according to exemplary embodiments. FIG. 3A is a perspective view, FIG. 3B is a side view, and FIG. 3C is an overhead view of the PDM housing elements. The PDM housing elements 300 are designed to support any one of the jumper bus bars 200 of FIGS. 2A-H. Several figures below show the jumper bus bar 200A used with the PDM housing elements 300, although the principles shown and described herein can be applied to the other jumper bus bars 200B, 200C, and 200D, as well as variations on the disclosed jumper bus bars.

The PDM housing elements 300 are designed to support the features of any one of the jumper bus bars 200 described above. Accordingly, the PDM housing elements 300 include a housing 302 that is distributed throughout the PDM (e.g., FIGS. 4A-4B) for seating fuses and/or relays. In exemplary embodiments, the housing 302 is made of a rigid, non-conductive plastic material. The housing 302 may be formed using injection mold technology, as one non-limiting example. In various locations, the housing 302 includes cavities for receiving the terminal assemblies of the jumper bus bars 200. Cavities 304*a* and 304*b* (FIG. 3A) are each designed to accept a terminal assembly of one of the jumper bus bars 200, such as one of the terminal assemblies 204, 206, or 224 in FIGS. 2A-2H. In FIG. 3C, a portion of the housing 302 is shown, including four cavities 304*c*, 304*d*, 304*e*, and 304*f* (collectively, "cavity/cavities 304"). In a non-limiting example, the cavity 304 is substantially a rectangular cube shape. A frame surface 312 is a surface of the housing 302 upon which the fuses and relays are disposed, where the frame 202 of the jumper bus bar 200 lays flat upon the frame surface. In exemplary embodiments, the frame surface 312 is substantially flat. When the frame surface 312 is positioned horizontally, the cavity 304 is vertically disposed downward from the frame surface. Thus, the cavity 304 is orthogonal to the frame surface 312.

The cavity 304 includes two ribs 306*a* and 306*b* (collectively, "ribs 306"). The ribs 306 extend perpendicularly upwardly from a bottom surface 318 of the cavity 304, with the ribs being separated by a channel 308 in the center of the cavity. Side channels 310*a* and 310*b* are formed also by the ribs 306, with side channel 310*a* formed between one side wall 316*a* of the cavity 304 and the rib 306*a* and side channel 310*b* formed between a second side wall 316*b* of the cavity and the rib 306*b* (collectively, "side channel(s) 310" and "side wall(s) 316"). In exemplary embodiments, the ribs 306 provide support to the terminal assembly (e.g., the fork terminals) of the jumper bus bar 200.

In exemplary embodiments, the cavity 304 includes an extrusion rib 322 disposed along a back wall of the cavity. The extrusion rib 322 extends perpendicularly downward from the frame surface 312 and is coplanar with the channel 308. In FIG. 3A, the cavity 304*a* is a cross-section, so a single extrusion rib 322*a* is shown. However, adjacent to (behind) cavity 304*a* is cavity 304*b*, which shows extrusion ribs 322*b* and 322*c* on opposing sides of the cavity (collectively, "extrusion ribs(s) 322"). Once the terminal of a fuse or relay is inserted into the channel 308 (through a slot of a jumper bus bar), the terminal will be disposed between the extrusion ribs 322 and is simultaneously disposed between the ribs 306. Thus, the PDM housing 300 ensures that the fuse/relay terminal is surrounded: by the ribs 306, on two opposing sides, and by the extrusion ribs 322, on the adjacent two opposing sides. Further, like the frame surface 312 of the housing 302, the extrusion ribs 322 provide support to the jumper bus bars 200, as illustrated further in FIGS. 10A and 10B, below.

In FIG. 3C, three of the cavities 304*c*, 304*d*, and 304*f* are disposed in a first arrangement while cavity 304*e* is disposed in a second arrangement which is perpendicular to the first arrangement. In exemplary embodiments, the housing of the PDM can be custom designed based on how the fuses, small relays, and large relays, as well as the jumper bus bars 200A, 200B, 200C, and/or 200D, are to be arranged. Further, the PDM elements are optimally arranged, in some embodiments, to fill its housing.

Figure 4A:
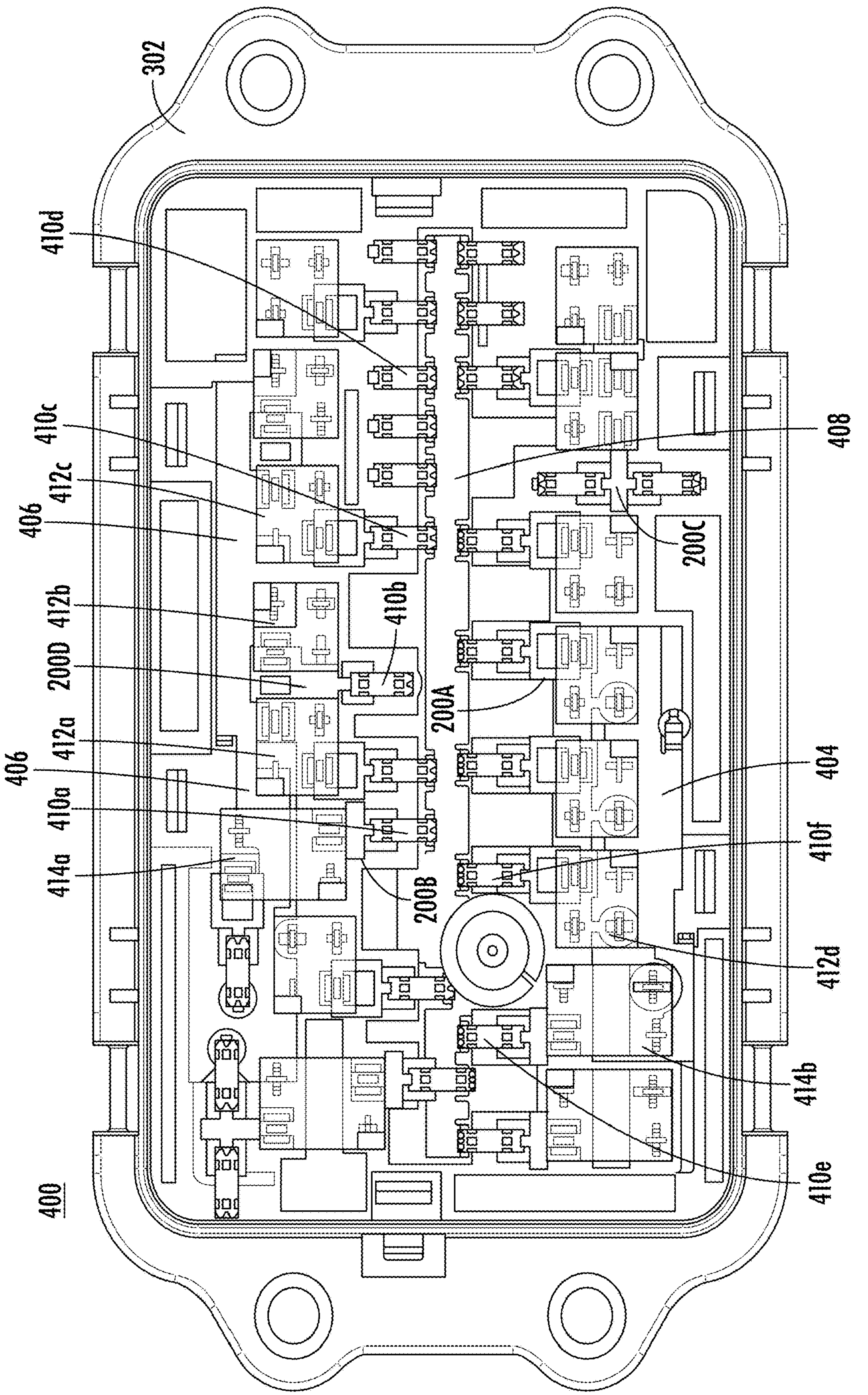
FIGS. 4A-4B are diagrams illustrating a PDM featuring jumper bus bars and PDM housing elements, in accordance with exemplary embodiments.
Figure 4B:
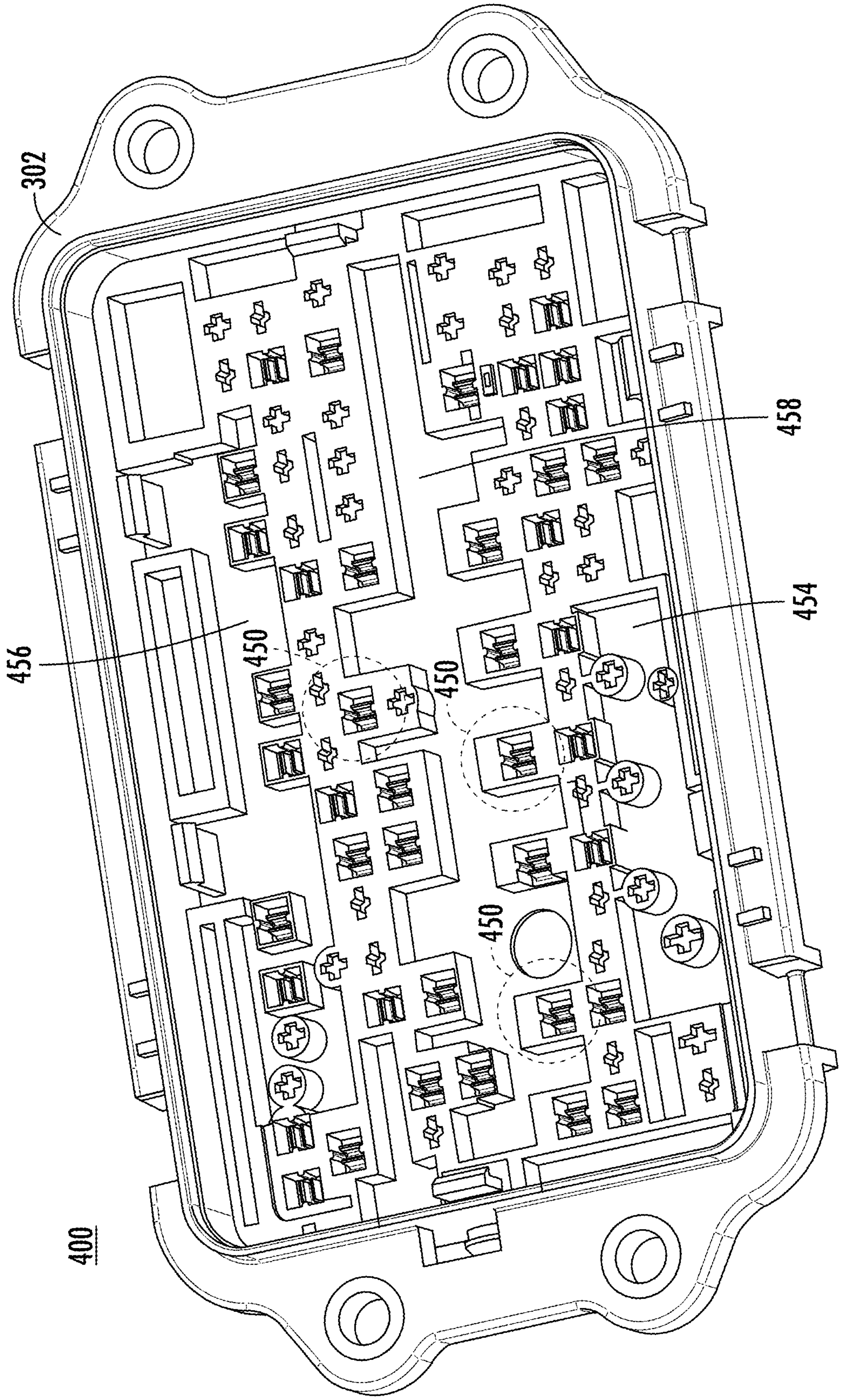

FIGS. 4A and 4B are representative drawings of a PDM 400 employing the jumper bus bar 200 of FIGS. 2A-2H and the PDM housing 300 of FIGS. 3A-3C, according to exemplary embodiments. FIG. 4A shows the fully populated PDM 400 including the jumper bus bars; FIG. 4B shows the housing elements 300. Jumper bus bars 200A, 200B, 200C, and 200D are shown on the PDM 400. In exemplary embodiments, the presence of the discrete jumper bus bars 200 in the PDM 400 provide a low-cost alternative to the more expensive and/or complex electrical bus implementations described above. Particularly when compared to PDMs with electrical buses made of bus bars, the use of several small bus bars 200 provides an alternative to the more widespread use of bus bars within the PDM housing, resulting in significant cost savings, in some embodiments.

As illustrated in FIG. 4A, the housing 302 of the PDM 400 features a ground bus bar 404, a ground bus bar 406, and an input bus bar 408. Jumper bus bars 200A, 200B, 200C, and 200D are shown. Several fuses, small relays, and large relays are also shown, with fuses 410*a-f*, small relays 412*a-d* , and large relays 414*a-b* called out specifically (collectively, "fuse(s) 410", small relay(s) 412", and "large relay(s) 414"). Many of the fuses 410 are directly connected to the input bus bar 408 but not to the ground bus bars 404 or 406. Similarly, many relays are connected to the ground bus bars 404 or 406 but not to the input bus bar 408. By establishing a connection between two or more devices, the jumper bus bars 200 help to complete the electrical bus of the PDM 400 in a cost-effective and simple manner, in some embodiments.

Fuse 410*a*, for example, is connected at one end to the input bus bar 408, then connected at the other end to jumper bus bar 200B. The jumper bus bar 200B is connected to a large relay 414*a*, which is connected to the ground bus bar 406. Both the fuse 410*a* and the large relay 414*a* thus are connected between the input bus bar 408 and the ground bus bar 406.

Fuse 410*b* is connected at one end to jumper bus bar 200D and its other terminal enables an external connection outside the PDM. The jumper bus bar 200D, which establishes up to three connections rather than the two connections of the jumper bus bar 200A, is connected to two relays 412*a* and 412*b*, while the two relays are connected to the ground bus bar 406.

Fuse 410*c* is connected at one end to the input bus bar 408, then connected at the other end to the jumper bus bar 200A. In contrast to the jumper bus bar 200D, the jumper bus bar 200A can establish connection to two devices, in some embodiments, and is connected at its other end to relay 412*c*. Relay 412*c* is connected to the ground bus bar 406. Both the fuse 410*c* and the relay 412*c* thus are connected between the input bus bar 408 and the ground bus bar 406.

FIG. 4B shows the housing 302 of the PDM 400, according to exemplary embodiments. The housing 302 is not populated with jumper bus bars, fuses, or relays. Locations 454 and 456 for the ground bus bars are shown, as well as locations 458 for the input bus bar. Locations 450 show the locations where jumper bus bars 200 may be inserted.

In exemplary embodiments, the jumper bus bars 200 provide both cost savings and weight savings over legacy bus bar configurations. Legacy bus bars can be 0.8 mm in thickness and above. The presence of such thick bus bars in the PDM can increase its weight significantly. By contrast, the thickness of the jumper bus bars 200 are about 0.3 mm. Since both the legacy bus bars and the novel jumper bus bars 200 allow current to flow, having a PDM with thinner bus bars, as is provided by the jumper bus bars 200, will result in cost savings, in exemplary embodiments, as well as a more lightweight PDM.

Figure 5A:
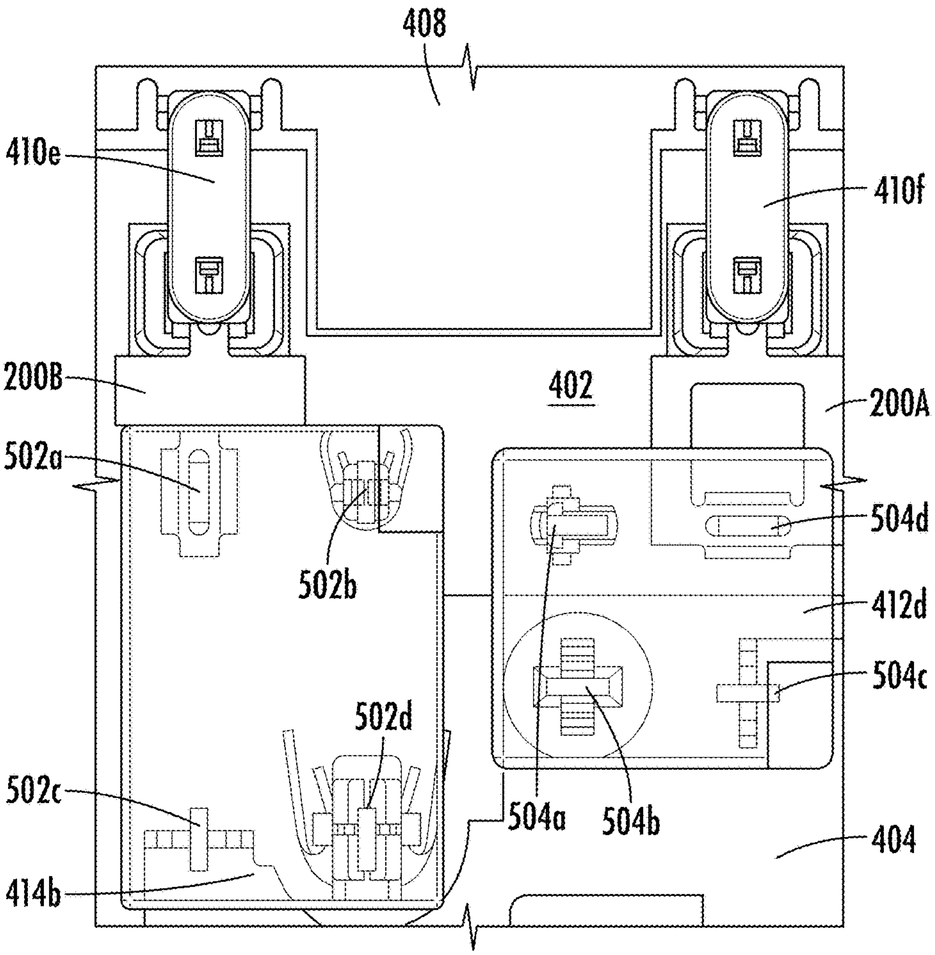
FIGS. 5A-5B are diagrams illustrating views of the PDM of FIG. 4, in accordance with exemplary embodiments.
Figure 5B:
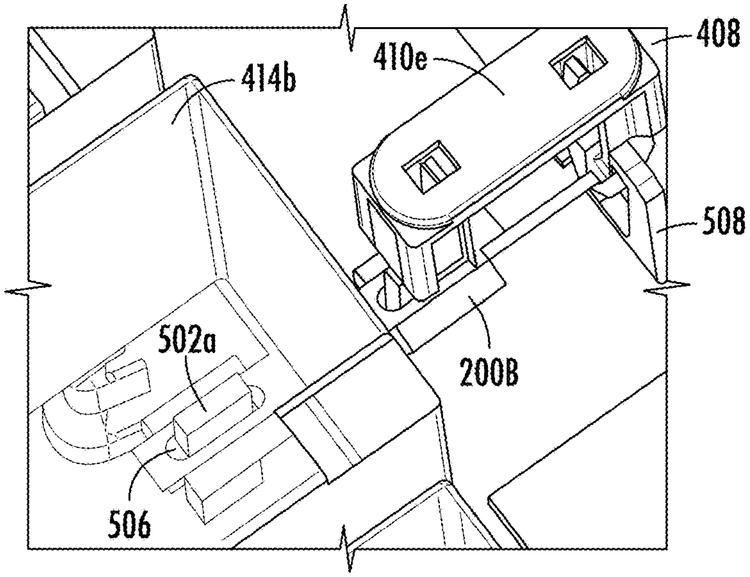

FIGS. 5A and 5B are representative drawings of the PDM 400 including the jumper bus bars 200A and 200B, according to exemplary embodiments. FIG. 5A is an exploded view of a portion of the PDM 400 (FIG. 4); and FIG. 5B is a perspective view of the portion featuring the jumper bus bar 200B. In FIG. 5A, two fuses 410*e* and 410*f* are connected at one end to the input bus bar 408. The other end of fuse 410*e* is connected to jumper bus bar 200B, which is connected to large relay 414*b*. The other end of fuse 410*f* is connected to jumper bus bar 200A, which is connected to small relay 412*d*. Both the large relay 414*b* and the small relay 412*d* are connected to the ground bus bar 404.

The large relay 414*b* includes four terminals 502*a-d* (collectively, "terminals 502"). Terminal 502*a* is connected to the jumper bus bar 200B, as described above, while terminal 502*c* is connected to the ground bus bar 404. Recall from FIG. 1A that the bus bar 136 includes tines 138 for connecting to terminals of a device. FIG. 5B shows tines 508 extending upward perpendicularly from the input bus bar 408, and the ground bus bar 404 similarly has tines for connecting to the terminals of the devices. The other terminals 502*b* and 502*d* are not connected to a bus bar. The housing 302 of the PDM 400 nevertheless has recesses for receiving the unconnected terminals 502*b-d*.

The small relay 412*d* includes four terminals 504*a-d* (collectively, "terminals 504"). Terminal 504*d* is connected to the jumper bus bar 200A, as described above, while terminal 504*c* is connected to the ground bus bar 404 and terminals 504*a* and 504*b* are connected to the individual terminal. As with the large relay 414*b*, the housing 302 includes recesses for receiving the unconnected terminals as well as the terminal to be connected to the ground bus bar 404 using tines.

Figure 6A:
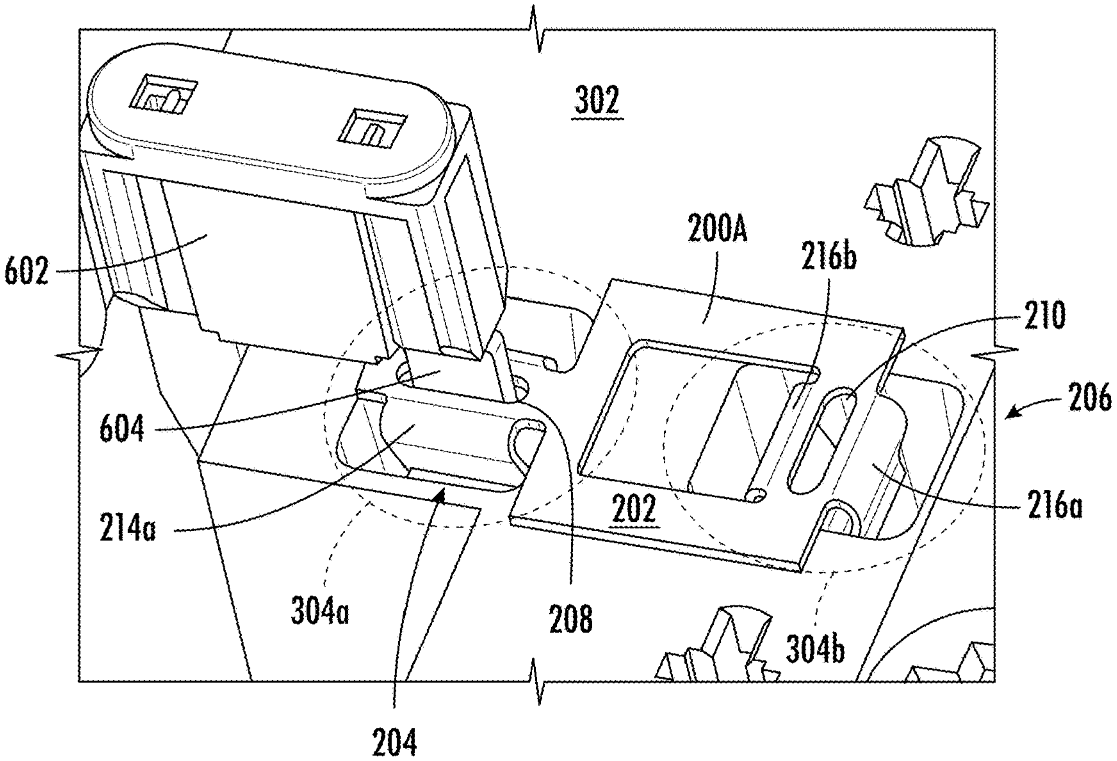
FIGS. 6A-6B are diagrams illustrating views of the PDM of FIG. 4, in accordance with exemplary embodiments.
Figure 6B:
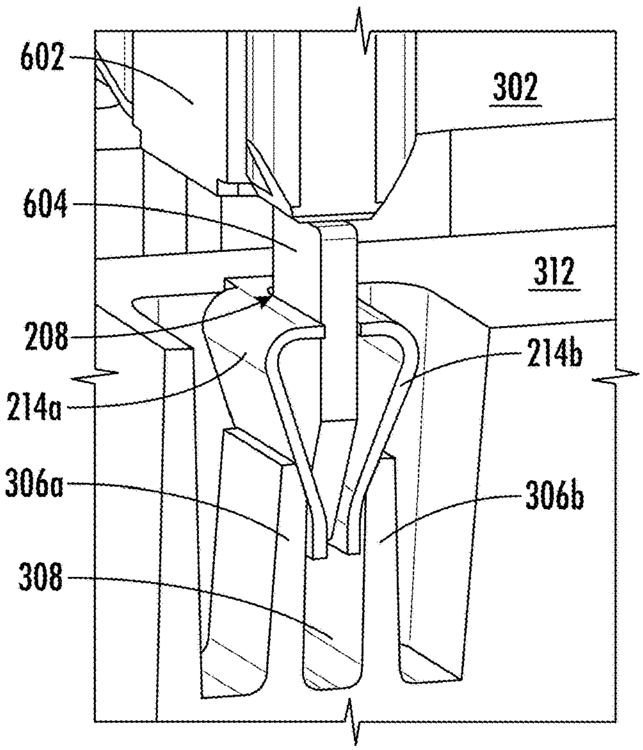

FIGS. 6A-6B are representative drawings (perspective views) of the PDM 400, according to exemplary embodiments. By combining the jumper bus bar 200 with the PDM housing elements 300, the PDM 400 provides an alternative to more expensive and/or more complex legacy PDMs. In the exemplary illustrations, a fuse 602 is shown, although a relay could also be used, as the jumper bus bar 200 and PDM housing elements 300 works with different sized relays as well as fuses.

FIG. 6A features the jumper bus bar 200A, which has two terminal assemblies 204 and 206 (FIGS. 2A-B). Accordingly, the housing 302 features two cavities, a cavity 304*a* for the terminal assembly 204 and a receiving cavity 304*b* for the terminal assembly 206. Once the fork terminals 214*a* and 214*b* of the terminal assembly 204 are inserted into the cavity 304*a* and the fork terminals 216*a* and 216*b* of the terminal assembly 206 are inserted into the cavity 304*b*, the frame 202 of the bus bar 200A lies flat against a surface of the housing 302. Once inserted into their respective cavities 304*a* and 304*b*, the fork terminals 214/216 abut against respective ribs 306 of the cavities 304*a* and 304*b*. Once the fuse terminal 604 is inserted into the slot 208, the ribs 306 ensure that the fork terminals 214 are positioned tightly against the terminal, such that current will flow therebetween. The ribs 306 thus facilitate proper seating of the terminal assemblies 204 and 206 in the housing 302 of the PDM 400 as well as a connection between terminal assemblies and fuse or relay terminals, in exemplary embodiments.

The fuse 602 includes a fuse terminal 604 that is inserted through slot 208 between the fork terminal 214*a* and the fork terminal 214*b* of the terminal assembly 204. The ribs 306 of the housing 302 are disposed on either side of the fork terminals 214. Once the terminal assembly 204 is inserted into the receiving cavity 304*a*, the fork terminals 214 are disposed between the ribs 306 in the channel 308, in exemplary embodiments. In exemplary embodiments, the ribs 306 are designed to be spaced so that contact is maintained between both fork terminals 214*a* and 214 and the fuse terminal 604. Put another way, once the fuse terminal 604 is inserted into the slot 208, the fuse terminal extends downward between the fork terminals 214 such that rib 306*a* is in contact with fork terminal 214*a*, fork terminal 214*a* is in contact with one side of fuse terminal 604, a second, opposing side of fuse terminal 604 is in contact with fork terminal 214*b*, and fork terminal 214*b* is in contact with rib 306*b*.

Further, in exemplary embodiments, the fork terminals 214*a* and 214*b* of the bus bar 200A push against respective ribs 306 in response to the downward force of the fuse terminal 604. The ribs 306 may deform somewhat in response to this downward force. In exemplary embodiments, the position of the fork terminal 214*a* relative to the fork terminal 214*b* at the bottom point is approximately the width of a fuse or relay terminal. In conjunction with the ribs 306 of the PDM housing elements 300, the fork terminals 214 of the jumper bus bar 200A ensure a consistent connection between the fuse terminal 604 and the fork terminals 214. Similar results are obtained with the fork terminals 216 of the terminal assembly 206, as well as with relay terminals.

Figure 7C:
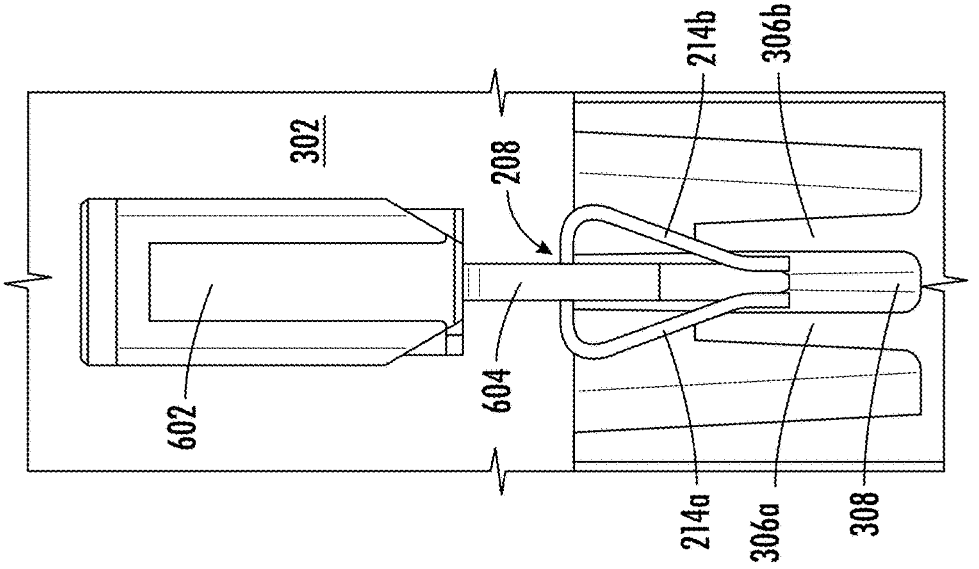
FIGS. 7A-7C are diagrams illustrating views of the PDM of FIG. 4, in accordance with exemplary embodiments.
Figure 7B:
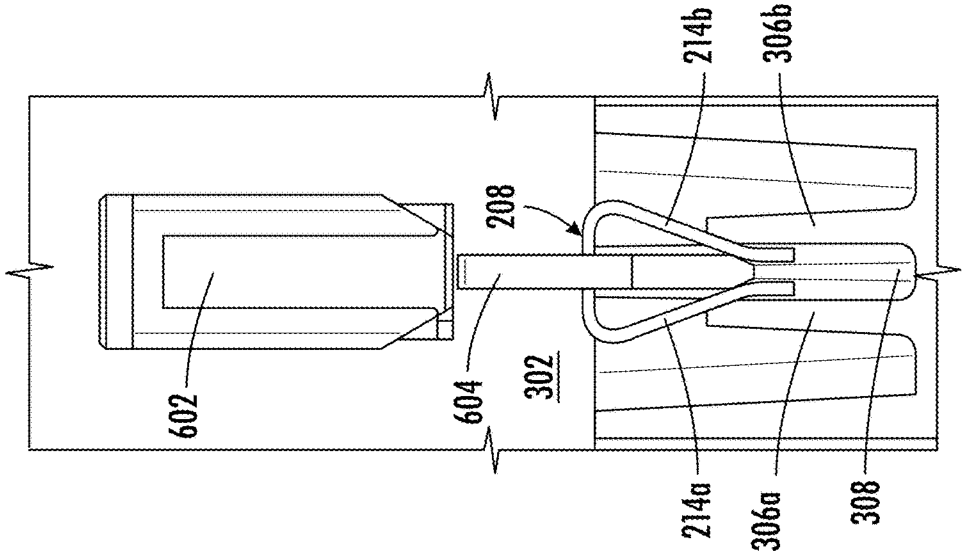
Figure 7A:
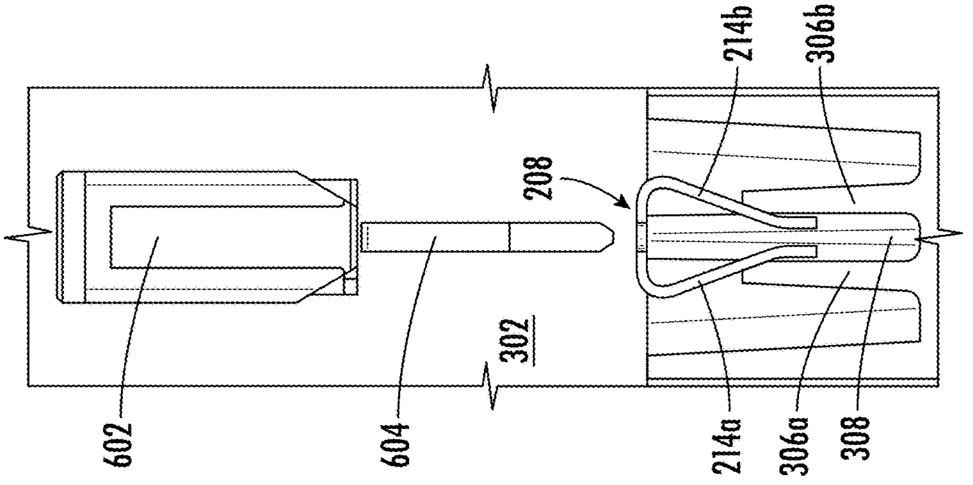

FIGS. 7A-7C are representative detailed views of the PDM 400, according to exemplary embodiments. FIG. 7A is a side view before the fuse terminal is inserted into fork terminals of the terminal assembly; FIG. 7B is a side view during insertion; and FIG. 7C is a side view of the fuse terminal fully inserted into the fork terminals. In exemplary embodiments, the fork terminals 214 do not change position. In a non-limiting example, the fork terminals 214 look somewhat like an upside-down Erlenmeyer flask. Fork terminal 214*a* is adjacent to and in contact with rib 306*a* and fork terminal 214*b* is adjacent to and in contact with rib 306*b*. In addition to the ribs 306, the housing 302 includes the channel 308 inside which the fuse terminal 604 of the fuse 602 is inserted. The fuse 602 is pushed downward, causing the fuse terminal 604 to exhibit a downward force toward the receiving channel 308. Although the position of the fork terminals 214 does not change, the fork terminals do exhibit a lateral force toward respective ribs 306. Thus, fork terminal 214 pushes against rib 306*a* while fork terminal 214*b* pushes against rib 306*b*. Although the ribs 306 are made of a rigid, plastic material, there is a small amount of lateral movement in response to the downward force of the fuse terminal 604, in some embodiments. Once the fuse 602 is fully inserted into the terminal assembly, the fork terminals 214 are pressed firmly against the fuse terminal 604, in exemplary embodiments. The fork terminals 214 and the ribs 306 thus work together to enable an electrical connection to be made between the fuse terminal 604 and the fork terminals 214 of the terminal assembly.

Figure 8:
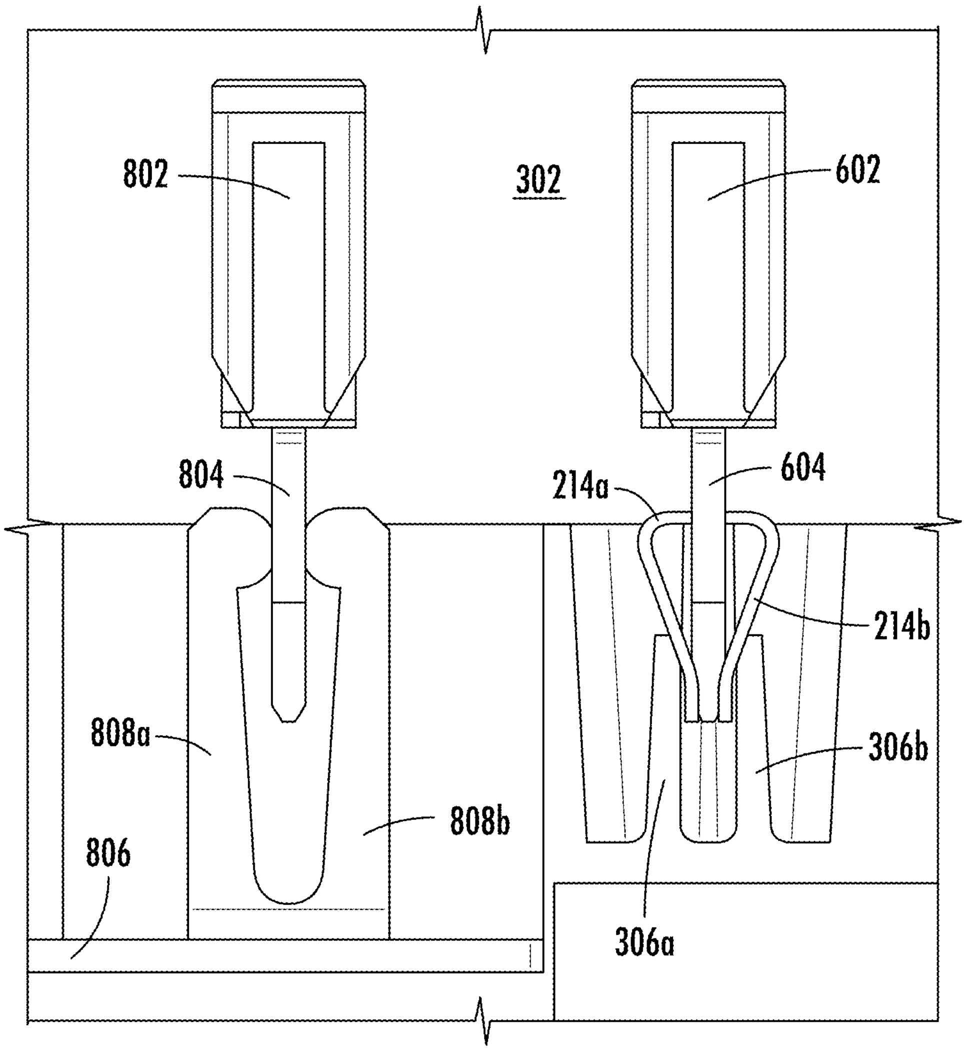
FIG. 8 is a diagram comparing the features of the PDM of FIG. 4 with legacy PDMs, in accordance with exemplary embodiments.

FIG. 8 is a representative drawing contrasting the PDM 400 with the legacy PDM, according to exemplary embodiments. On the left side is a legacy configuration featuring a fuse 802 having a fuse terminal 804; on the right side, the already introduced fuse 602 with fuse terminal 604. The fuse 602 and the fuse 802 may be the same type of fuse. A bus bar 806 includes two tines 808*a* and 808*b* (collectively, "tines 808"). When the fuse 802 is moved downward, the fuse terminal 804 is inserted between the tines 808. In this way, a connection between the fuse 802 and the bus bar 806 is established for allowing current flow through the fuse.

The connection between the fuse terminal 604 and the fork terminals 214 has been explained herein. The PDM housing elements 300, namely, the ribs 306, ensure that, once the fuse terminal 604 is inserted between the fork terminals 214, a connection between the fuse and the bus bar (to which the fork terminals are connected) is established for allowing current flow through the fuse 602. The small amount of conductive material of the fork terminals 214 is apparent in FIG. 8, relative to the large amount of conductive material of the legacy bus bar 806 and tines 808.

In exemplary embodiments, the height and weight of the PDM 400 are 50% less than with legacy PDMs. Further, in exemplary embodiments, the thickness of the jumper bus bars of the PDM 400 is about 62.5% less than that of the bus bars for a legacy PDM. The PDM 400 shows that using thick, heavy, and expensive bus bars of legacy PDMs is not necessary, as the jumper bus bars 200, combined with the PDM housing elements 300, are low-cost and simple adjuncts to the already existing electrical bus of the PDM. Further, the manufacture and assembly process for the novel design shown and described herein is not complex. The PDM housing elements 300 can be formed using injection molding or similar technology. Further, the assembly of the jumper bus bars inside the PDM is not complex, as the terminal assemblies of each jumper bus bar is easily inserted into dedicated cavities of the PDM housing. The exemplary PDM 400 thus provides several advantages over legacy PDMs.

Figure 9C:
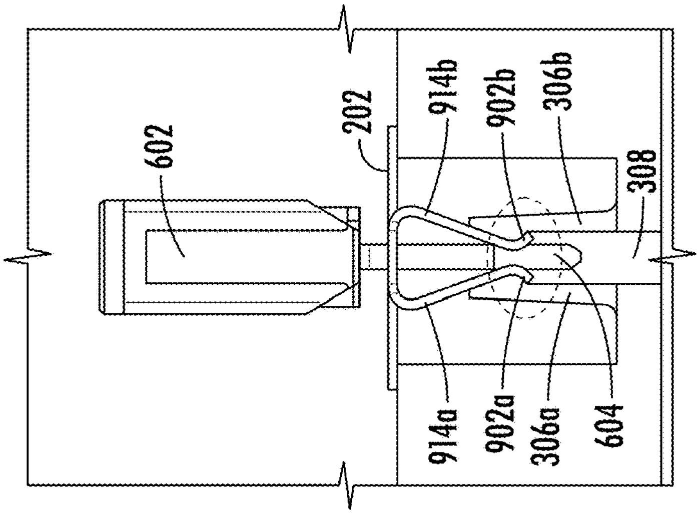
FIGS. 9A-9C are diagrams illustrating views of the PDM of FIG. 4, in accordance with exemplary embodiments.
Figure 9B:
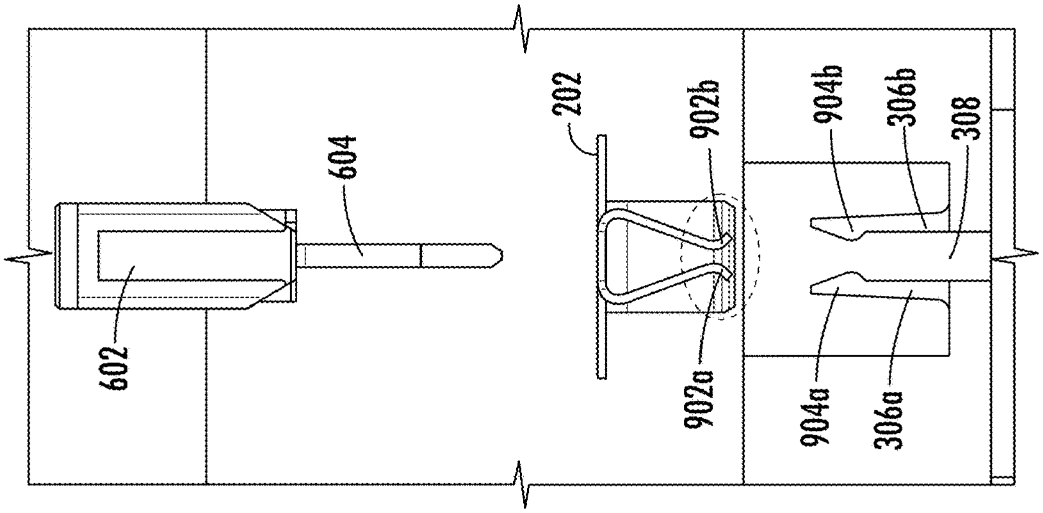
Figure 9A:
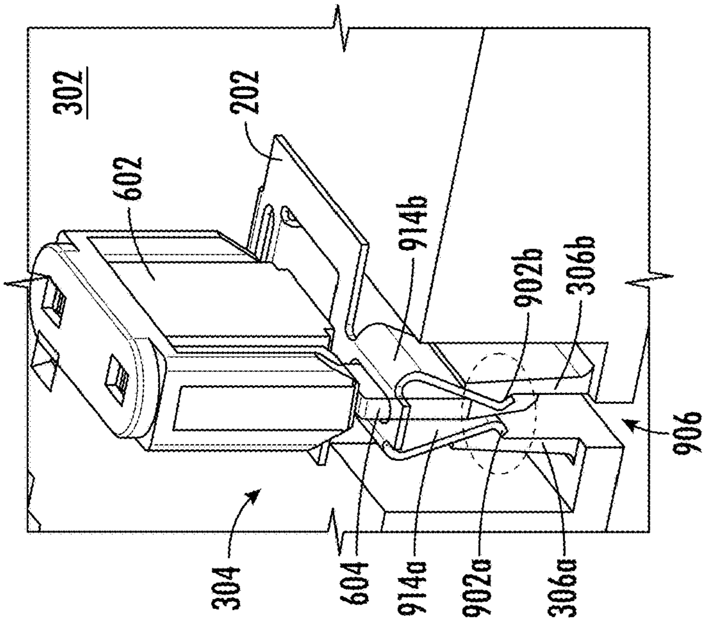

FIGS. 9A-9C are representative drawings of the PDM 400 featuring modified hook terminals, according to exemplary embodiments. FIG. 9A is a perspective view and FIGS. 9B-9C are side views. As indicated with the dashed circles, hook terminals 914*a* and 914*b* are different from the fork terminals 214*a* and 214*b* shown and described thus far (collectively, "hook terminal(s) 914"). The hook terminals 914 feature bends at ends distal to the frame 202. Hook terminal 914*a* includes bend 902*a* while hook terminal 914*b* includes bend 902*b* (collectively, "bend(s) 902").

In exemplary embodiments, the ribs 306 may optionally include features to hold the hook terminals 914 of the terminal assembly in place. The ribs 306 include lips 904: rib 306*a* includes lip 904*a* while rib 306*b* includes lip 904*b* (collectively, "lip(s) 904"). The lip 904*a* laterally extends the rib 306*a* into the space occupied by the channel 308; similarly, the lip 904*b* laterally extends the rib 306*b* into the space occupied by the channel. As shown in FIG. 9C, the lips 904 are designed to mate with the shape of the hook terminals 914 such that the lips are in contact with the hook terminals.

In exemplary embodiments, the bends 902 of respective hook terminals 914 mate with the lips 904 of respective ribs 306. While the lips 904 extend the ribs 306 into the space of the channel 308, the bends 902 of the hook terminals 914 fit underneath the lips. The bends 902 combined with the lips

904 thus provide some additional insurance against the jumper bus bar moving upward once inserted into the housing, in exemplary embodiments.

In exemplary embodiments, with or without the 904, the ribs 306 provide support to the fork terminals of the terminal assembly. After installing the jumper bus bar 200 into the housing, the lips 904 will clip the hook terminals 914, in exemplary embodiments. This ensures that the hook terminals 914 will not be moved or fall during the manufacturing process. One or more of the fork terminals 214, 216, or 228 shown and described in FIGS. 2A-2H, above, may be replaced with hook terminals 914, in exemplary embodiments.

Further, in exemplary embodiments, the cavity 304 of the housing 302 may feature a through hole 906, as illustrated in FIG. 9A. For ribs having no lips, such as the ribs 306 in FIG. 6B, the cavity does not feature the through hole 906, in some embodiments. But, for ribs 306 having lips 904, the through hole 906 enables a molding tool to mold the hook. If the PDM has IP 67 or IP 69K ingress protection (against ingress of water, dust, and other debris), then the through hole 906 would be capped with a bottom cover, in exemplary embodiments.

Figure 10B:
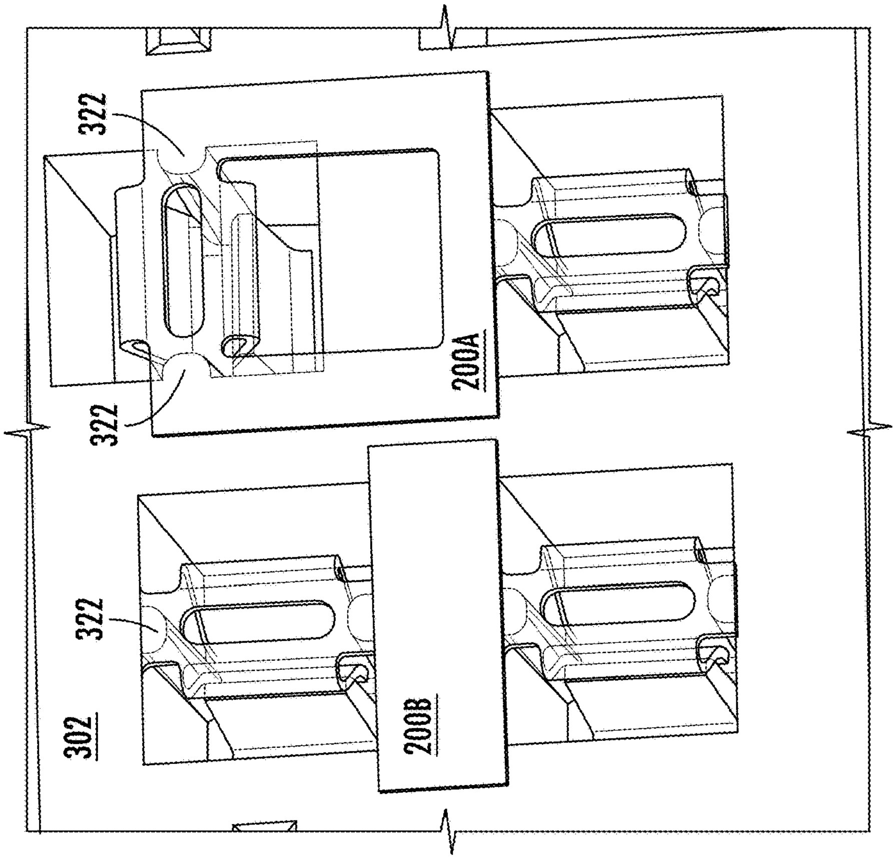
FIGS. 10A-10B are diagrams illustrating views of the PDM housing elements of FIGS. 3A-3C, in accordance with exemplary embodiments.
Figure 10A:
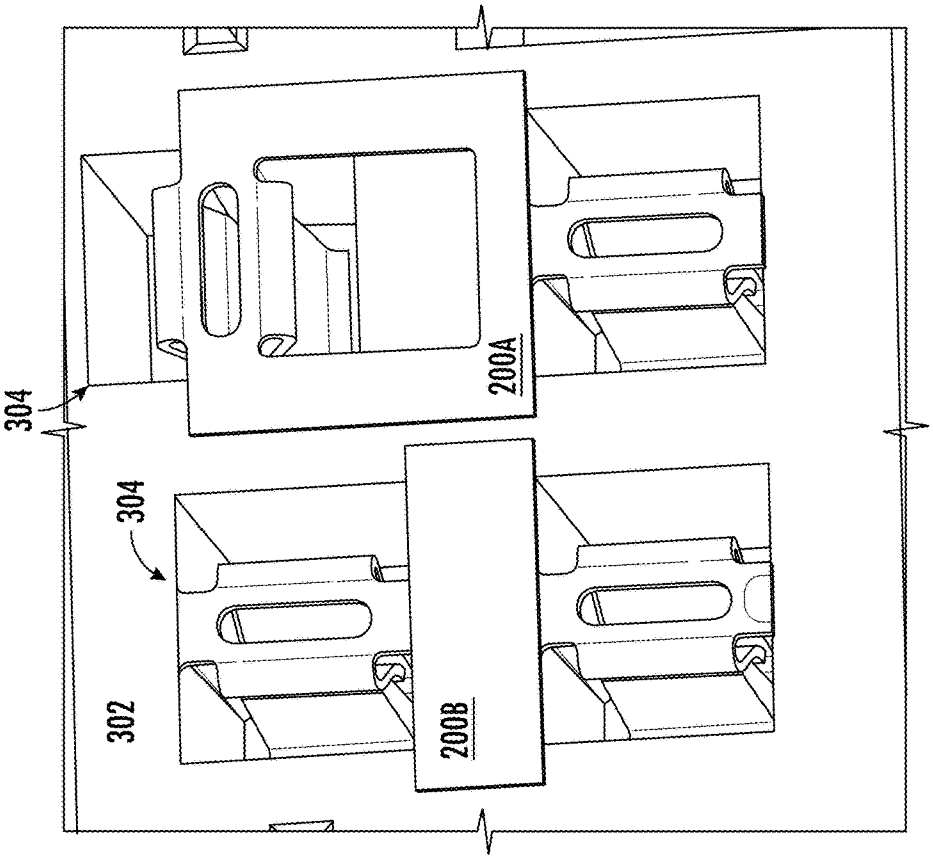

FIGS. 10A and 10B are representative drawings showing the extrusion ribs 322 of FIGS. 3A-3B in more detail, according to exemplary embodiments. Jumper bus bars 200A and 200B are shown in cavities 304 of the housing 302. In FIG. 10A, the extrusion ribs 322 are not shown, as they are covered by the jumper bus bars 200A and 200B. In FIG. 10B, the jumper bus bars 200A and 200B are shown transparently, so that the extrusion ribs 322 are visible. In exemplary embodiments, the jumper bus bars 200 are seated on the extrusion ribs 322, just as the frames 202 of the jumper bus bars are seated on the frame surface 312 of the housing 302 (FIGS. 3A-C). The extrusion ribs 322 thus provide support to the jumper bus bars 200 once they are inserted into the cavities 304.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure refers to certain embodiments, numerous modifications, alterations, and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. An electrical box comprising:
a housing comprising:
a surface; and
a cavity disposed orthogonal to the surface, the cavity comprising a pair of ribs extending upward from a bottom surface of the cavity, the pair of ribs forming a central channel therebetween; and
a jumper bus bar comprising:
a frame seated along the surface; and
a first terminal assembly disposed within the cavity, the first terminal assembly comprising:
a first fork terminal disposed orthogonal to the frame;
a second fork terminal disposed orthogonal to the frame, wherein the first fork terminal is adjacent the second fork terminal; and
a first slot to receive a first terminal of the fuse or the relay, wherein the first slot is coplanar with the frame,
wherein the pair of ribs abut against exterior surfaces of the first fork terminal and the second fork terminal to position interior surfaces of the first fork terminal and the second fork terminal tightly against the terminal located therebetween, and
wherein the interior surfaces of the first fork terminal and the second fork terminal are opposite the exterior surfaces of the first fork terminal and the second fork terminal.

2. The electrical box of claim 1, further comprising an appendage extending outward from the frame, wherein the appendage is coplanar with the frame.

3. The electrical box of claim 2, wherein the first terminal assembly is disposed on the appendage.

4. The electrical box of claim 1, wherein the first terminal assembly is disposed on the frame.

5. The electrical box of claim 1, further comprising a second terminal assembly comprising:
a third fork terminal disposed orthogonal to the frame;
a fourth fork terminal disposed orthogonal to the frame, wherein the third fork terminal is adjacent the fourth fork terminal; and
a second slot to receive a second terminal of the fuse or the relay, wherein the second slot is coplanar with the frame.

6. The electrical box of claim 5, wherein the first slot is perpendicular to the second slot.

7. The electrical box of claim 5, wherein the first slot is along an axis and the second slot is along the axis.

8. The electrical box of claim 1, wherein the frame further comprises an aperture.

9. A power distribution module to house a fuse or a relay, the power distribution module comprising:
a housing comprising:
a substantially flat surface; and
a cavity disposed orthogonal to the surface, the cavity comprising a pair of ribs extending upward from a bottom surface of the cavity, the pair of ribs forming a central channel therebetween; and
a jumper bus bar comprising:
a frame seated upon the substantially flat surface; and
a terminal assembly disposed within the cavity, the terminal assembly comprising:
a first fork terminal disposed orthogonal to the frame;
a second fork terminal disposed orthogonal to the frame, wherein the first fork terminal is adjacent the second fork terminal; and
a slot to receive a terminal of the fuse or the relay, wherein the slot is coplanar with the frame,
wherein the pair of ribs abut against exterior surfaces of the first fork terminal and the second fork terminal to position interior surfaces of the first fork terminal and the second fork terminal tightly against the terminal located therebetween to maintain a connection therebetween for current flow, and
wherein the interior surfaces of the first fork terminal and the second fork terminal are opposite the exterior surfaces of the first fork terminal and the second fork terminal.

10. The power distribution module of claim 9, wherein the terminal assembly is attached to the frame, with the first fork terminal and the second fork terminal being disposed on opposite sides of and extending orthogonally downward from the slot.

11. The power distribution module of claim 9, the jumper bus bar further comprising an appendage extending outward from and coplanar to the frame, the appendage comprising the slot.

12. The power distribution module of claim 11, wherein the terminal assembly is attached to the appendage, with the first fork terminal and the second fork terminal being disposed on opposite sides of and extending orthogonally downward from the slot.

13. The power distribution module of claim 9, the pair of ribs further comprising:

a first rib comprising a first lip, wherein the first lip is in contact with the first fork terminal; and a second rib comprising a second lip, wherein the second lip is in contact with the second fork terminal.

14. The power distribution module of claim 13, the first fork terminal further comprising a first bend at an end of the first fork terminal distal to the frame and the second fork terminal further comprising a second bend at a second end of the second fork terminal distal to the frame.

15. The power distribution module of claim 9, wherein the central channel is surrounded by a first side channel and a second side channel.

16. The housing power distribution module of claim 15, wherein the cavity is a rectangular cube.

17. The power distribution module of claim 15, wherein the central channel and the first side channel form a first rib of the pair of ribs.

18. The power distribution module of claim 17, wherein the central channel and the second side channel form a second rib of the pair of ribs.

* * * * *